United States Patent [19]

Ise

[11] Patent Number: 4,861,952
[45] Date of Patent: Aug. 29, 1989

[54] PRESSURE ACTIVATED SWITCH

[75] Inventor: Yoji Ise, Tokyo, Japan

[73] Assignee: Kabushiki Kaisha Myotoku, Tokyo, Japan

[21] Appl. No.: 198,172

[22] Filed: May 24, 1988

[30] Foreign Application Priority Data

May 26, 1987 [JP] Japan .............................. 62-79286[U]

[51] Int. Cl.$^4$ ............................................ H01H 35/38
[52] U.S. Cl. .............................. 200/81 R; 200/82 R; 200/81.5; 200/85 R
[58] Field of Search ................. 200/5 R, 18, 47, 85 R, 200/81 R, 82 R, 81.4, 81.5, 159 B, 81.9 R; 340/611, 626, 666; 307/118

[56] References Cited

U.S. PATENT DOCUMENTS

| 3,472,059 | 10/1969 | Pruett | 200/81.5 |
| 3,576,568 | 4/1971 | Thirion | 200/81.5 |
| 4,079,215 | 3/1978 | Berggren | 200/81.4 |
| 4,172,216 | 10/1979 | O'Shea | 200/85 R |
| 4,453,052 | 6/1984 | Semian | 200/85 R |
| 4,524,256 | 6/1985 | Miyata et al. | 200/85 R |
| 4,551,713 | 11/1985 | Aossey | 200/85 R |

*Primary Examiner*—Gerald P. Tolin
*Attorney, Agent, or Firm*—Bauer & Schaffer

[57] ABSTRACT

A pressure switch wherein electrode plates are provided on both sides of a pressure conductive rubber plate. The pressure switch is interposed between a body and a receiving block slidably fitted to the body so that both electrodes may be connected with each other by connecting the rubber plate into conductive state to obtain an electric signal across the electrodes. The pressure applied to the rubber plate is regulated by a variable spring.

1 Claim, 2 Drawing Sheets

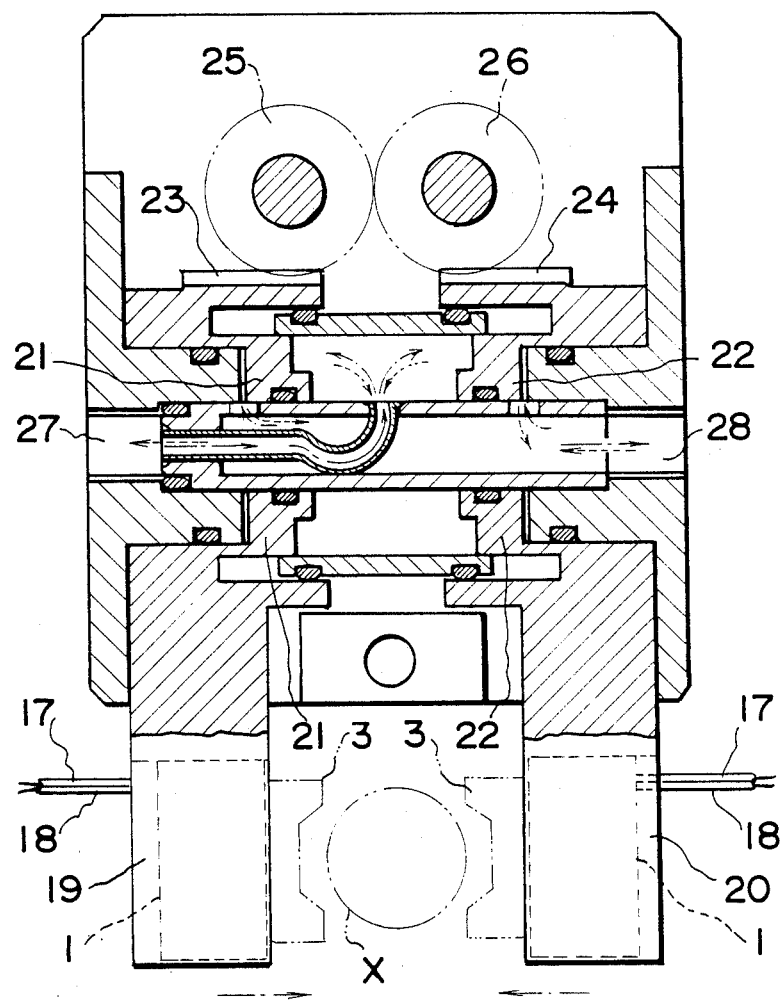

PRESSURE ACTIVATED SWITCH

This invention relates to a pressure switch.

BACKGROUND OF THE INVENTION

Recently, various types of working machines have been automated. For example, various gripping apparatus for gripping and conveying workpieces and parts to predetermined positions have been developed.

The present applicant has disclosed in Laid Open Japanese utility model application laid open No. 58044/1986, apparatus for gripping workpieces and parts, wherein respective gripping pawls are provided in opposition to each other having their rear ends within a housing body. The body defines an air cylinder to which air under pressure, is fed to provide movement for the gripping pawls. Pinions are located in the body which mesh with racks, formed respectively at the ends of the above mentioned gripping pawls, so that the above mentioned gripping pawls may be operated inwardly and outwardly with respect to each other.

However, the above mentioned apparatus is controlled by feeding, exhausting and switching the applied air pressure to the gripping pawls. It is difficult to use to grip fragile glass parts of deformable workpieces and parts. Consequently, such known gripping apparatus has been used only to grip metallic and other workpieces and parts which have comparatively high strength; but it has not been used to grip fragile glass parts or deformable workpieces and parts. In situations involving the gripping of fragile glass parts or deformable workpieces and parts, it is preferable to control the stopping of the gripping pawls, when gripping is completed by detecting the gripping pressure actually applied to the workpieces and parts, or concretely to apply the ideal pressure under which the workpieces and parts are perfectly gripped without being broken or deformed.

OBJECT AND SUMMARY OF THE INVENTION

The present invention has as an object, to provide a pressure activated switch adapted to the case mentioned above.

In order to attain this object, the present invention utilizes a pressure applied conductive rubber, such as that marketed under the trade name of JSR PCR 101 or JSR PCR 105, produced by Japan Synthetic Rubber Company, Ltd., is rendered conductive when subjected to compression. The above mentioned rubber has characteristics such that, if it is not compressed or, is only partly pressed, the non-pressed part will be insulated and the pressed part will be conductive.

In accordance with the present invention, the pressure switch comprises a body and a pressure receiving block slidably fitted to the body. Interposed between the body and the block is an assembly consisting sequentially of an electrode plate insulated from the body surface, a pressure applied conductive rubber plate and an electrode plate insulated from the pressure receiving block surface. A bolt inserted through the above-mentioned layers from the body side and is screwed and fixed at its tip to a threaded bore in the back surface of the pressure receiving block. A spring adjustable, in response to a spring applied pressure, is pushed againsts the head of the bolt and lead wires are attached to and lead out of the above-mentioned electrode plates.

THE DRAWINGS

FIG. 2 is a sectional view of a part of a gripping apparatus for workpieces and parts showing the pressure switch of the present invention as set, respectively, in the gripping pawls;

DETAILED DESCRIPTION OF THE INVENTION

An embodiment of the present invention will be explained in detail hereinbelow with reference to the drawings.

In the present invention, a pressure applied conductive rubber marketed under the trade name JSR PCR 101 or JSR PCR 105 and produced by Japan Synthetic Rubber Company, Ltd., is utilized. The above-mentioned pressure applied conductive rubber has characteristics such that, if it is not pressed is non-conductive or if only partly pressed, the non-pressed part will be an insulate and the pressed part will be conductive.

Figure 1:
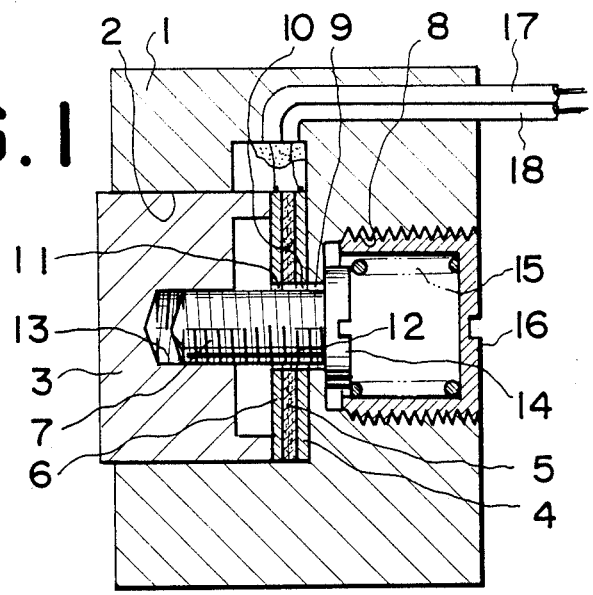
FIG. 1 is a vertically sectional view of a pressure switch according to the present invention.

Referring now to FIG. 1, reference numeral 1 represents a body provided on one side with a recess in which a pressure receiving block 3 is slidably fitted. Between the above-mentioned body 1 and the slidably fitted pressure receiving block 3, there are provided sequentially an electrode plate 4 insulated from the body 1, a pressure applied conductive rubber plate 5 and an electrode plate 6 insulated from the pressure receiving block 3.

If the body 1 and pressure receiving block 3 are formed of an insulating material, no particular insulating work or material will be required for the insulation between the body 1 and electrode plate 4 and between the pressure receiving block 3 and electrode plate 6. In the illustrated embodiment, the body 1 and pressure receiving block 3 are made of an insulating material. A bolt 7 is inserted through the above-mentioned electrode plates 4 and 6 and the pressure applied conductive rubber plate 5 from the body side and is screwed and fixed at the tip to the back surface of the pressure receiving block 3. That is to say, a female screw recess 8 is formed on the side opposite the above mentioned recess 2. A through hole 9 is made through the bottom of the above-mentioned female screw recess, through holes 10 and 11 and made respectively through the bottom of the above-mentioned female screw recess, through holes 10 and 11 are made respectively through both electrode plates 4 and 6 and a through hole 12 is made through the pressure applied conductive rubber plate 5. Bolt 7 is inserted through these through holes 9, 10, 12 and 11 and is screwed and fixed at the tip in a female screw hole 13 made on the back surface of the above-mentioned pressure receiving block 3. An applied pressure adjustable spring 15 is disposed and pushed against the above-mentioned bolt 7 on the head 14 thereof.

In the above-mentioned embodiment, a cap-like hollow bolt 16 is used to adjust the applied pressure of the spring 15. That is to say, the cap-like hollow bolt 16 is screwed into the female screw recess 8 of body 1 as a pressing means or presser of the spring 15 so that, by rotating the hollow bolt 16, the pressure applied to bolt 7 on the head 14 thereof by spring 15, may be adjusted.

Lead wires 17 and 18 are connectd to and lead out, respectively, from the electrode plates 4 and 6 to complete the present invention.

Figure 3:
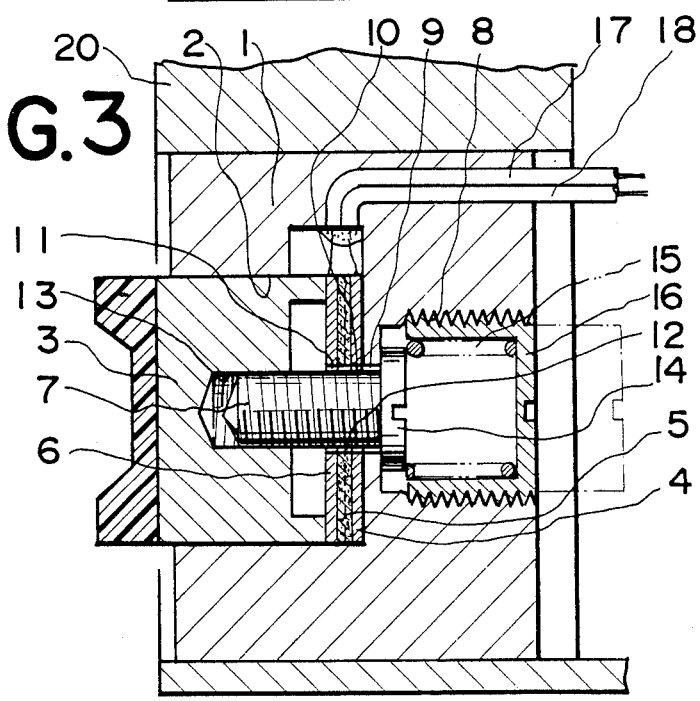
FIG. 3 is a partial enlarged vertical sectional view of the pressure switch shown in FIG. 2.

Referring now to FIGS. 2 and 3 which show an example of the gripping apparatus briefly referred to above utilizing the pressure switches of the present invention, a detailed explanation of this known gripping apparatus is not set forth herein except as needed to understand the utilization of the switch of this invention therewith.

In this connection, pistons 21 and 22 (FIG. 2) are formed at the rear ends respectively, of gripping pawls 19 and 20 of the gripping apparatus, and pinions 25 and 26 mesh respectively with racks 23 and 24 which are further provided at the rear ends of the gripping pawls and which mesh with each other, so that the gripping pawls 19 and 20 may be moved inwardly and outwardly as opposed to each other.

When air is fed through ventillating port 27 and is exhausted through ventilating port 28, gripping pawls 19 and 20 will respectively move outwardly to be opened. On the other hand, when air is fed through ventilating port 28 and is exhausted through ventilating port 27, the gripping pawls 19 and 20 will respectively move inwardly in the direction of the arrows shown in FIG. 2 close to grip a workpiece or part X.

In the known gripping apparatus briefly described and illustrated, the pressure switch of the present invention is utilized inside one or each of the gripping pawls 19 and 20.

The operation of the pressure, switch of the present invention shall be explained as utilized on the above-described gripping apparatus. In the present invention, in conformity with any pressure applied to the pressure receiving block 3 from the workpiece X, an electric signal is obtained through lead wires 17 and 18 to stop the gripping operation of the gripping pawls 19 and 20.

For example, in the case where the workpiece or part X to be gripped is a fragile glass part or deformable part, the gripping pawls 19 and 20 will have to be stopped before they contact the break or deform such part.

Therefore, the pressure switch of the present invention is formed to obtain an electric signal so that, in case a pressure required to perfectly grip any workpiece or part X is applied to the pressure receiving block 3, the pressure applied conductive rubber plate 5 will become conductive.

Initially, operation is described in a case where a small pressure is applied to the pressure receiving block 3 and the pressure applied to the conductive rubber plate 5 is conductive. In such case, the resiliency of the spring 15 pressed applied to the pressure receiving block 3 by the spring 15 through the bolt 7 may be made weak or nearly zero.

Since even the slightest change in pressure will produce an electrical current in the rubber plate 5, the pressure switch must be initially calibrated to provide a predetermined threshold pressure beyond which the clamping jaws are to be arrested. Thus, when the block 3 is first inserted into the clamping pawl 20, 21, or when operation is resumed after a "down" condition, the position of the spring 15 must be adjusted to regulate the force on the head 14 of the bolt 7. This is accomplished by adjustment of the follow cap 16, which will increase or decrease the outward force on the block 3 against which the workpiece is grasped.

Therefore, for example, when a glass workpiece or the like is to be clamped with a small pressure, the spring force 15 is loosened so that the block 32d can be more sensitive to applied pressure. The applied pressure renders the rubber plate 5 conductive, so that the electrode plates 4 and 6 become electrically connected with each other and an electric signal is provided through the lead wires 17 and 18. The electric signal is fed, for example, to a solenoid valve or the like (not illustrated) through which air under pressure is fed. In this manner, the pawls of the gripping pawls 19 and 20 will be able to be stopped and the glass part or the like will be able to be gripped without being broken. Similarly, a deformable workpiece will be able to be held without being deformed.

When the workpiece or part X has considerable weight and must be tightly gripped to prevent its falling, the hollow bolt 16 is screwed down tightly as shown in FIGS. 2 and 3, so that the spring 15 will apply greater pressure on the bolt 7. Therefore, the block 3 can be strongly pressed by the workpiece or part X before a change is sensed by the rubber plate 5. Only when the pressure applied to the conductive rubber plate 5 is such that it is pressed against the electrode plates 4 and 5, that an electric signal will be obtained through the lead wires 17 and 18 to provide the necessary signal to the solenoid valve or the like (not illustrated) to arrest the gripping operation of the gripping pawls 19 and 20.

The pressure applied to the bolt 7 on the head 14 thereof may be further adjusted in accordance with the present invention by replacing the spring with another one from several pre-preparing springs of different resiliency.

Further, when a particularly fragile part is being handled, the hollow bolt 16, as well as the spring 15 may be removed, making the block 3 most sensitive. Thus after the spring 15 and hollow bolt 16 are removed, the rubber plate 5 will be pressed only by the pressure receiving block 3 and electrode plate 6. If the applied pressure is maintained, for example, just below the level where the rubber plate 5 becomes conductive, any subsequent small or minute force applied to the pressure receiving block 3 will result in the passage of an electric signal.

If a pressure were always maintained on the conductive rubber plate 5, the plate 5 will become quickly fatigued and improperly react to changes. In this respect, the durability of the pressure switch 5 rubber plate 15 is improved since it may be held at a null or unpressured position and still be prepared for operation. It is also possible to employ mechanical contacts, such as a limit switch, to control the stopping of the gripping pawls 19 and 20. However, in this case, the contacts are likely to spark. It is thus dangerous to use such a switch in a machine or work place where combustible materials are handled. On the other hand, the pressure switch of the present invention is not likely to spark and is, therefore, safer to use.

What is claimed is:

1. A pressure activated switch comprising a body, a pressure receiving block slidably fitted to said body, and a pressure sensing assembly interposed between said body and block comprising in sequence, a first electrode plate insulated from the body, a pressure applied conductive rubber plate, a second electrode plate insulated from the pressure receiving block, and a bolt passing through the electrode plates and pressure applied conductive rubber plate to hold said plates together, said bolt being fixed at its tip to said pressure receiving block for conjoint movement therewith, an adjustable pressure spring disposed between said assembly and said body biasing said assembly away from said body and lead wires attached to and leading out of said electrode plates whereby an electrical signal is established when pressure is applied via said block to compress said assembly against said body.

* * * * *